(12) United States Patent
Lin et al.

(10) Patent No.: US 11,276,346 B2
(45) Date of Patent: Mar. 15, 2022

(54) SIMPLIFIED SENSING CIRCUIT AND SAMPLE AND HOLD CIRCUIT FOR IMPROVING UNIFORMITY IN OLED DRIVER

(71) Applicant: NOVATEK Microelectronics Corp., Hsin-Chu (TW)

(72) Inventors: Jin-Yi Lin, Kaohsiung (TW); Chieh-An Lin, Taipei (TW); Jhih-Siou Cheng, New Taipei (TW); Ju-Lin Huang, Hsinchu County (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 0 days.

(21) Appl. No.: 16/253,171

(22) Filed: Jan. 21, 2019

(65) Prior Publication Data
US 2020/0234636 A1    Jul. 23, 2020

(51) Int. Cl.
*G09G 3/36* (2006.01)
*G09G 3/3225* (2016.01)
(Continued)

(52) U.S. Cl.
CPC ......... *G09G 3/3225* (2013.01); *G11C 27/026* (2013.01); *H03F 3/45179* (2013.01); *H03K 3/356113* (2013.01); *G09G 2310/0289* (2013.01); *G09G 2310/0291* (2013.01); *G09G 2310/0294* (2013.01); *G09G 2320/029* (2013.01); *G09G 2320/0233* (2013.01); *G09G 2320/043* (2013.01); *G09G 2330/12* (2013.01);
(Continued)

(58) Field of Classification Search
CPC ......... G09G 2310/0294; G09G 3/3225; G09G 2310/0289; G09G 2310/0291; G09G 2320/0233; G09G 2320/029; G09G 2320/043; G09G 2330/12; H03F 3/45179; H03F 2203/45156; H03F 2203/45461; H03K 3/356113
See application file for complete search history.

(56) References Cited

U.S. PATENT DOCUMENTS

| | | | |
|---|---|---|---|
| 2006/0170638 A1* | 8/2006 | Sloof | G09G 3/2011 345/98 |
| 2013/0222335 A1* | 8/2013 | Lee | G06F 3/04166 345/174 |

(Continued)

*Primary Examiner* — Sanghyuk Park
(74) *Attorney, Agent, or Firm* — Winston Hsu (57) ABSTRACT

A sensing circuit for an organic light-emitting diode driver includes a sample and hold circuit and a gain amplifier. The sample and hold circuit is configured to sample a sensing signal received via an input terminal. The gain amplifier is coupled to the sample and hold circuit. The sample and hold circuit includes a first capacitor, a second capacitor, a first switch, a second switch, a third switch and a fourth switch. The first capacitor is coupled between the input terminal and the gain amplifier. The second capacitor is coupled between a reference terminal and the gain amplifier. The first switch is connected between the first capacitor and the input terminal. The second switch is connected between the second capacitor and the reference terminal. The third switch is connected between the first capacitor and the gain amplifier. The fourth switch is connected between the second capacitor and the gain amplifier.

5 Claims, 13 Drawing Sheets

(51) Int. Cl.
*G11C 27/02* (2006.01)
*H03F 3/45* (2006.01)
*H03K 3/356* (2006.01)

(52) U.S. Cl.
CPC .............. *H03F 2203/45156* (2013.01); *H03F 2203/45461* (2013.01)

(56) References Cited

U.S. PATENT DOCUMENTS

| | | | | |
|---|---|---|---|---|
| 2014/0368415 A1* | 12/2014 | Kim | ................ | G09G 3/3208 345/77 |
| 2015/0091618 A1* | 4/2015 | Min | ................ | G09G 3/3291 327/93 |
| 2015/0091888 A1* | 4/2015 | Min | ................ | G09G 3/3291 345/212 |

* cited by examiner

SIMPLIFIED SENSING CIRCUIT AND SAMPLE AND HOLD CIRCUIT FOR IMPROVING UNIFORMITY IN OLED DRIVER

BACKGROUND OF THE INVENTION

1. Field of the Invention

The present invention is related to a sensing circuit and a sample and hold circuit for an organic light-emitting diode (OLED) driver, and more particularly, to a sensing circuit and a sample and hold circuit which are capable of sensing parameters of pixel elements in an OLED driver.

2. Description of the Prior Art

An organic light-emitting diode (OLED) is a light-emitting diode (LED) in which the emissive electroluminescent layer is a film of organic compound, where the organic compound emits light in response to an electric current. OLEDs are widely used in displays of electronic devices such as television screens, computer monitors, and portable systems such as mobile phones, handheld game consoles and personal digital assistants (PDAs). An active matrix OLED (AMOLED), which is driven by a thin-film transistor (TFT) and contains a storage capacitor that maintains the pixel states to enable large size and large resolution displays, becomes the mainstream of the OLED panels.

In a general OLED panel, each pixel cell includes three subpixels, each of which has an OLED with one of the three primary colors, for composing a target color to be displayed in the pixel cell. A subpixel receives a voltage signal from a driver integrated circuit (IC). A TFT then converts the voltage signal into a driving current, which drives the OLED to emit light. The luminance of the OLED is determined by the driving current of the OLED. However, in the OLED panel, the TFT in different sub-pixels may possess an error or mismatch in the device parameter, which may result in different voltage-to-current conversion behaviors. In addition, there may also be a mismatch in the luminous efficiency of the OLED. After a long-time operation, the OLED panel may undergo degradations in voltage-to-current conversion and luminous efficiency. Therefore, the uniformity of the OLED display may be decreased since different locations on the OLED display may possess different levels of degradations.

In order to improve the uniformity of the OLED panel, the source driver is usually equipped with a sensing circuit responsible for sensing the degrading level of the parameters such as the luminous efficiency of the OLED and/or the device parameters of the TFT. Please refer to FIG. 1, which is a schematic diagram of a common OLED control system 10. The OLED control system 10 includes an image processor 102, a source driver 104 and an OLED panel 106. The image processor 102 may be implemented as a system on a chip (SOC), for outputting display data and performing the sensing operation for the OLED panel 106. The source driver 104 includes a driving circuit 110 and a sensing circuit 120. The driving circuit 110 includes multiple channels each having an operational amplifier or a buffer for outputting driving signals. The sensing circuit 120 includes multiple channels each having a sampler circuit. The sensing scheme is that the driving circuit 110 transmits a driving signal to a target subpixel on the OLED panel 106 via a driving line and the sensing circuit 120 correspondingly receives a sensing signal from the subpixel via a sensing line.

Figure 1:
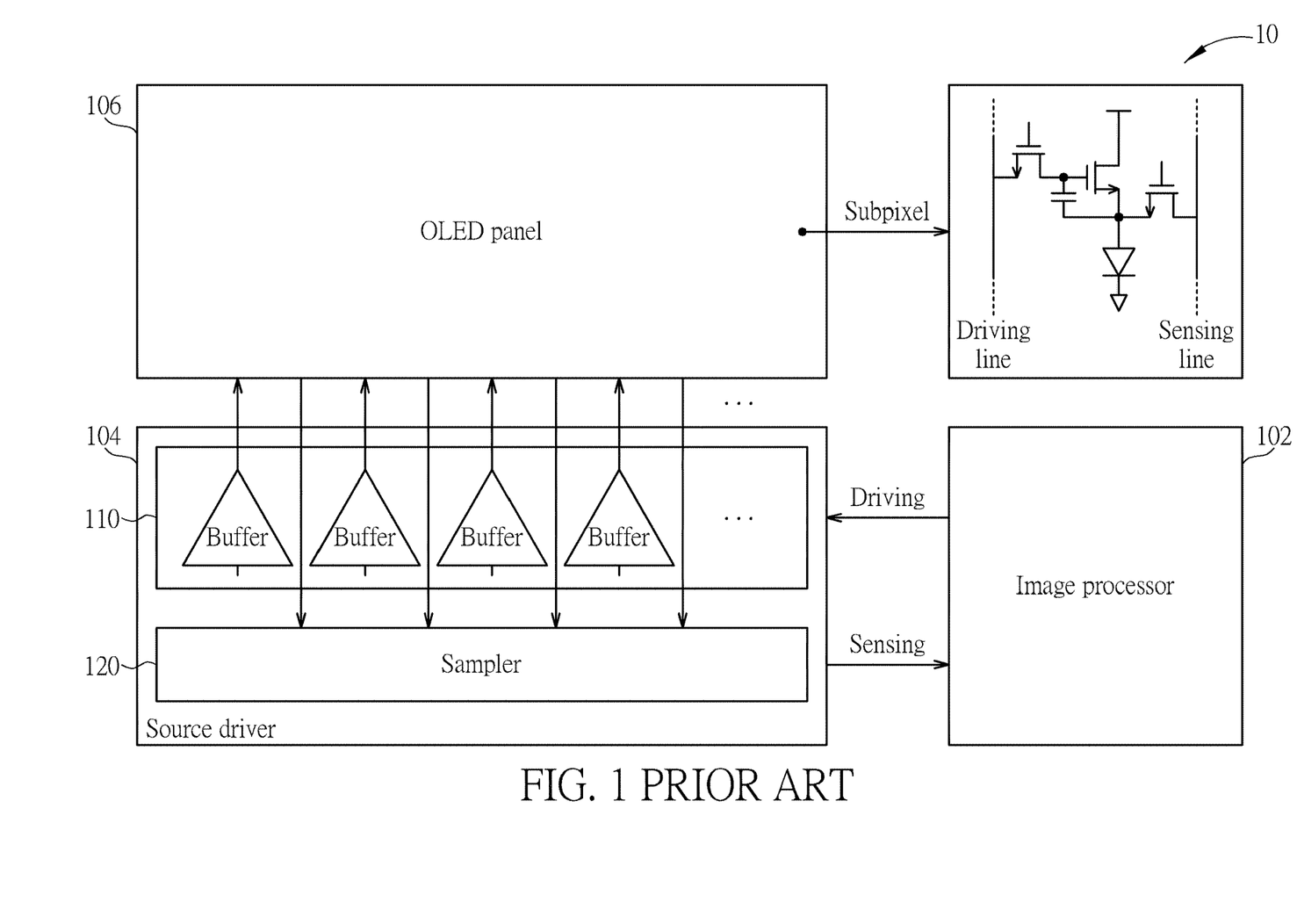
FIG. 1 is a schematic diagram of a common OLED control system.

The OLED panel 106 and associated source driver 104 are requested to operate in any circumstance such as different temperatures and different environments. Therefore, the sensing circuit 120 should maintain the same performance under different temperatures and process variations. In addition, each channel of the sensing circuit 120 should also operate with an identical performance with no or less variation, so as to achieve the uniformity of sensing operations. Thus, how to improve the uniformity of the sensing circuit has become an important issue to be solved in the art.

SUMMARY OF THE INVENTION

It is therefore an objective of the present invention to provide a novel structure of the sample and hold circuit, to reduce the influence of the parasitic capacitance on the output signal of the sensing circuit, so as to improve the uniformity of sensing operations on the organic light-emitting diode (OLED) panel.

An embodiment of the present invention discloses a sensing circuit for an OLED driver. The sensing circuit comprises a sample and hold circuit and a gain amplifier. The sample and hold circuit is configured to sample a sensing signal received via an input terminal. The gain amplifier is coupled to the sample and hold circuit. The sample and hold circuit comprises a first capacitor, a second capacitor, a first switch, a second switch, a third switch and a fourth switch. The first capacitor is coupled between the input terminal and the gain amplifier. The second capacitor is coupled between a reference terminal and the gain amplifier. The first switch is connected between the first capacitor and the input terminal. The second switch is connected between the second capacitor and the reference terminal. The third switch is connected between the first capacitor and the gain amplifier. The fourth switch is connected between the second capacitor and the gain amplifier.

Another embodiment of the present invention discloses a sample and hold circuit of a sensing circuit used for an OLED driver. The sample and hold circuit is configured to sample a sensing signal received via an input terminal, and the sample and hold circuit comprises a first capacitor, a second capacitor, a first switch, a second switch, a third switch and a fourth switch. The first capacitor is coupled between the input terminal and a gain amplifier of the sensing circuit. The second capacitor is coupled between a reference terminal and the gain amplifier. The first switch is connected between the first capacitor and the input terminal. The second switch is connected between the second capacitor and the reference terminal. The third switch is connected between the first capacitor and the gain amplifier. The fourth switch is connected between the second capacitor and the gain amplifier.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
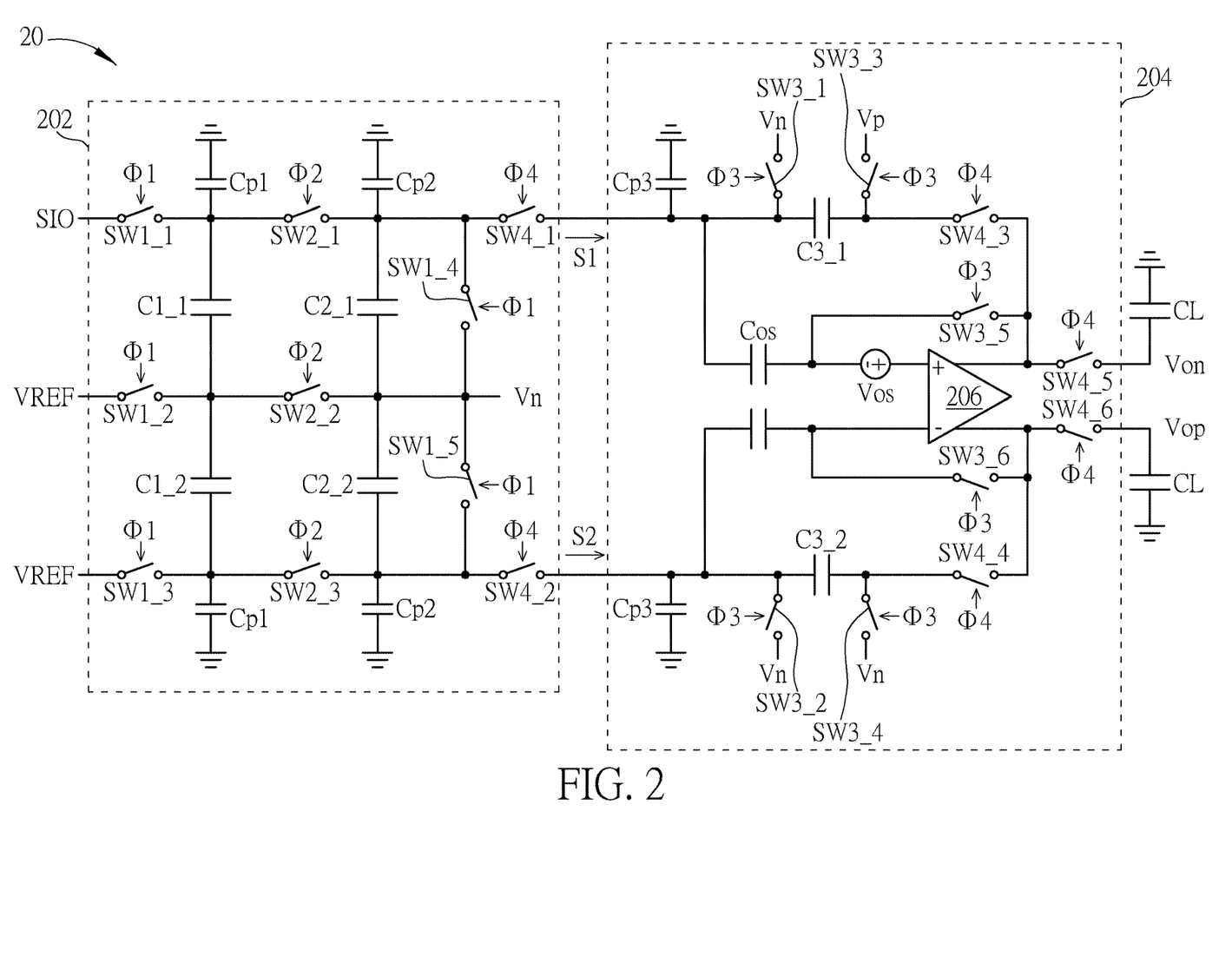
FIG. 2 is a schematic diagram of a sensing circuit.

Please refer to FIG. 2, which is a schematic diagram of a sensing circuit 20, which may be implemented in an organic light-emitting diode (OLED) driver for sensing parameters of pixel elements in the OLED driver. The sensing circuit 20 includes a sample and hold circuit 202 and a gain amplifier 204. Note that there may be multiple channels included in the sensing circuit 20 and each channel is composed of a sample and hold circuit and a gain amplifier, and only one channel is illustrated in FIG. 2 for brevity.

In detail, the sample and hold circuit 202 is configured to sample a sensing signal SIO received from a sensing line of the OLED driver, and thereby output sampling signals S1 and S2. The sample and hold circuit 202 includes capacitors C1_1, C1_2, C2_1 and C2_2, and switches SW1_1, SW1_2, SW1_3, SW1_4, SW1_5, SW2_1, SW2_2, SW2_3, SW4_1 and SW4_2. The switches SW1_1-SW1_5 are controlled by a switching signal Φ1, the switches SW2_1-SW2_3 are controlled by a switching signal Φ2, and the switches SW4_1 and SW4_2 are controlled by a switching signal Φ4. The information of the sensing signal SIO is sampled to be stored in the capacitor C1_1 and then forwarded to the capacitor C2_1. The sample and hold circuit 202 further receives a reference voltage VREF as a reference, which is sampled to be stored in the capacitor C1_2 and then forwarded to the capacitor C2_2. In the sample and hold circuit 202, there are parasitic capacitances Cp1 and Cp2 respectively coupled to the capacitors C1_1, C1_2, C2_1 and C2_2. Most of these parasitic capacitances may be, for example, junction capacitances of metal-oxide semiconductor field-effect transistors (MOSFETs) such as the MOSFETs constructing the switches in the sample and hold circuit 202. The values of the junction capacitances are highly dependent on temperature and process variations.

The gain amplifier 204 receives the sampling signals S1 and S2, and thereby generates output signals Von and Vop. The gain amplifier 204 includes capacitors C3_1 and C3_2, switches SW3_1, SW3_2, SW3_3, SW3_4, SW3_5, SW3_6, SW4_3, SW4_4, SW4_5 and SW4_6, and an operational amplifier 206. The switches SW3_1-SW3_6 are controlled by a switching signal Φ3, and the switches SW4_3-SW4_6 are controlled by the switching signal Φ4. In the gain amplifier 204, there are parasitic capacitances Cp3 at the input terminals, where most of the parasitic capacitances Cp3 may also be the junction capacitances of MOSFETs. An offset voltage Vos and offset capacitors Cos of the operational amplifier 206 are also illustrated in FIG. 2, for showing the offset phenomenon that is required to be canceled in the operations of the gain amplifier 204. In addition, the output terminals of the gain amplifier 204 are further coupled to loading capacitors CL, which refer to any capacitive loads at the output terminals of the sensing circuit 20.

The detailed operations of the sensing circuit 20 may be separated into several phases, as described below.

Figure 3A:
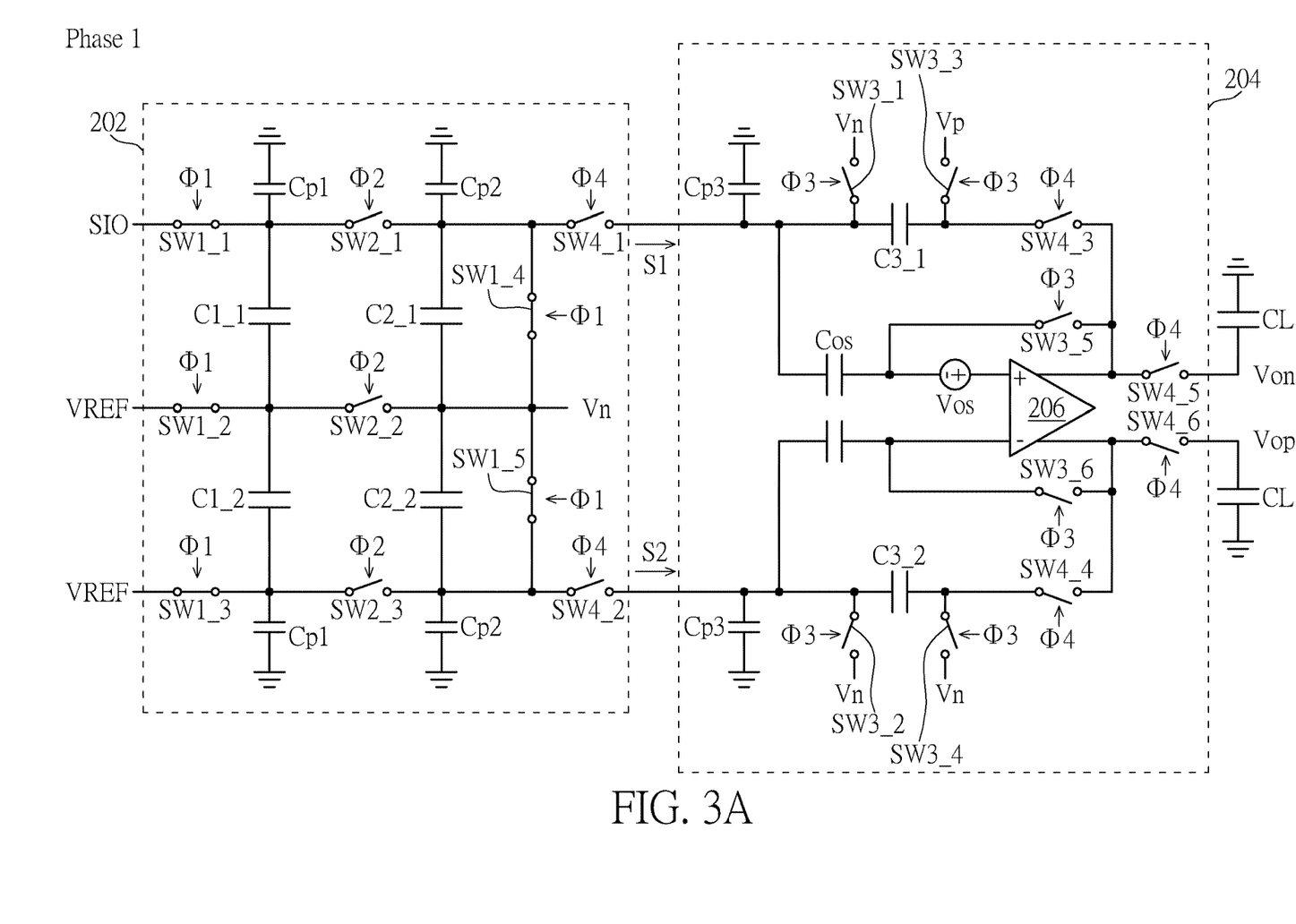
FIGS. 3A-3D are schematic diagrams of operations of the switches in the sensing circuit shown in FIG. 2.

In Phase 1, the switches SW1_1-SW1_5 are conducted (closed) by the switching signal Φ1, and other switches are turned off (open), as shown in FIG. 3A. The sample and hold circuit 202 starts to receive the sensing signal SIO, which is sampled to the top plate of the capacitor C1_1 via the switch SW1_1. The reference voltage VREF is also received and sampled to the bottom plate of the capacitors C1_1 and C1_2 via the switches SW1_2 and SW1_3, as a reference for generating the differential output. Meanwhile, the switches SW1_4 and SW1_5 are conducted, to reset the capacitors C2_1 and C2_2 by connecting the top plate and the bottom plate of each of the capacitors C2_1 and C2_2, so as to eliminate the charges previously stored in the capacitors C2_1 and C2_2. After Phase 1 is complete, the information of the sensing signal SIO is sampled and stored in the capacitor C1_1.

Figure 3B:
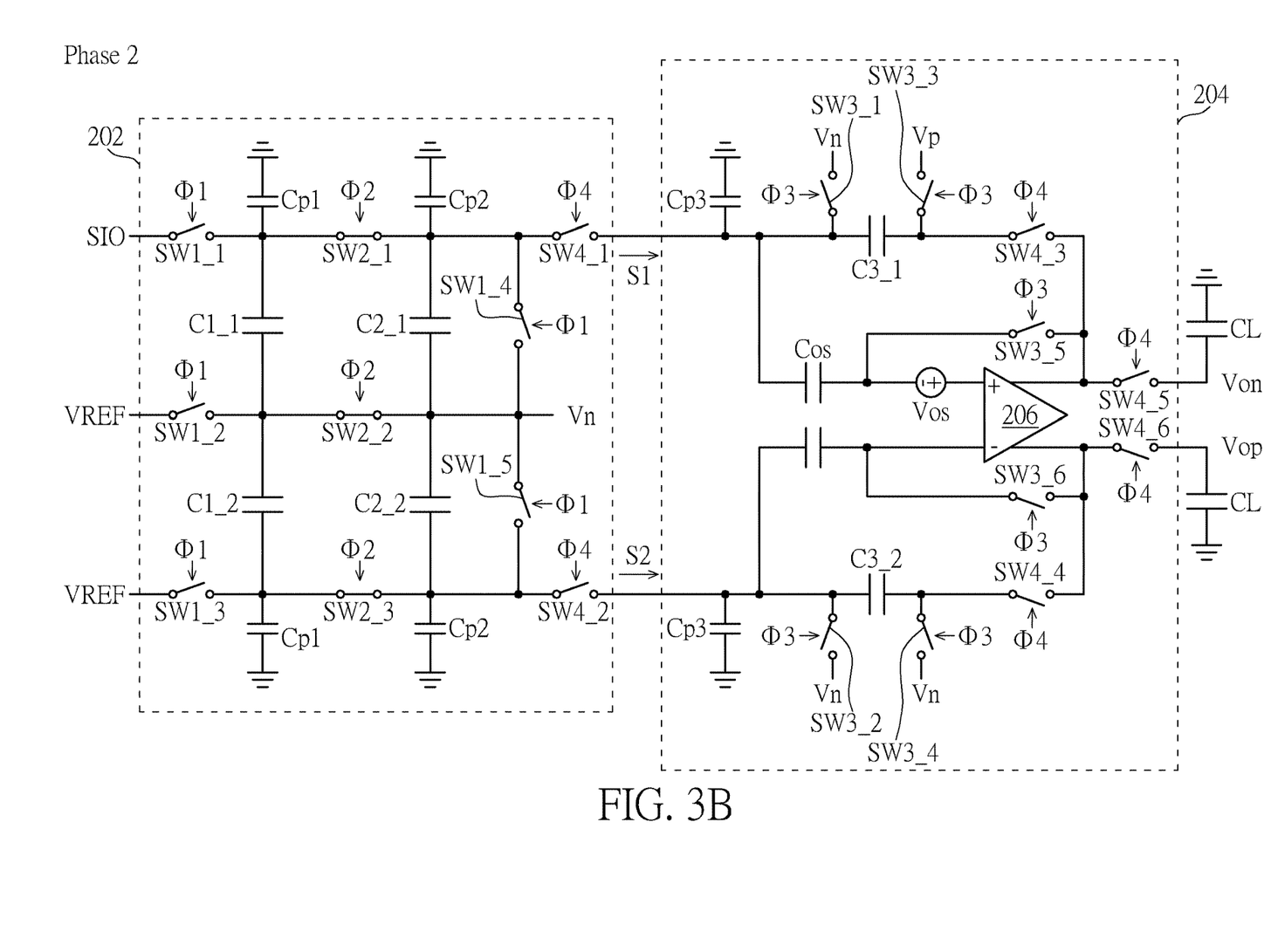

In Phase 2, the switches SW2_1-SW2_3 are conducted by the switching signal Φ2, and other switches are turned off, as shown in FIG. 3B. Charge sharing is performed between the capacitors C1_1 and C2_1, so that the sensing signal SIO is sampled to the top plate of the capacitor C2_1. In addition, charge sharing is performed between the capacitors C1_2 and C2_2, so that the reference voltage VREF is sampled to the bottom plate of the capacitors C2_1 and C2_2. After Phase 2 is complete, the information of the sensing signal SIO is stored in the capacitor C2_1.

Figure 3C:
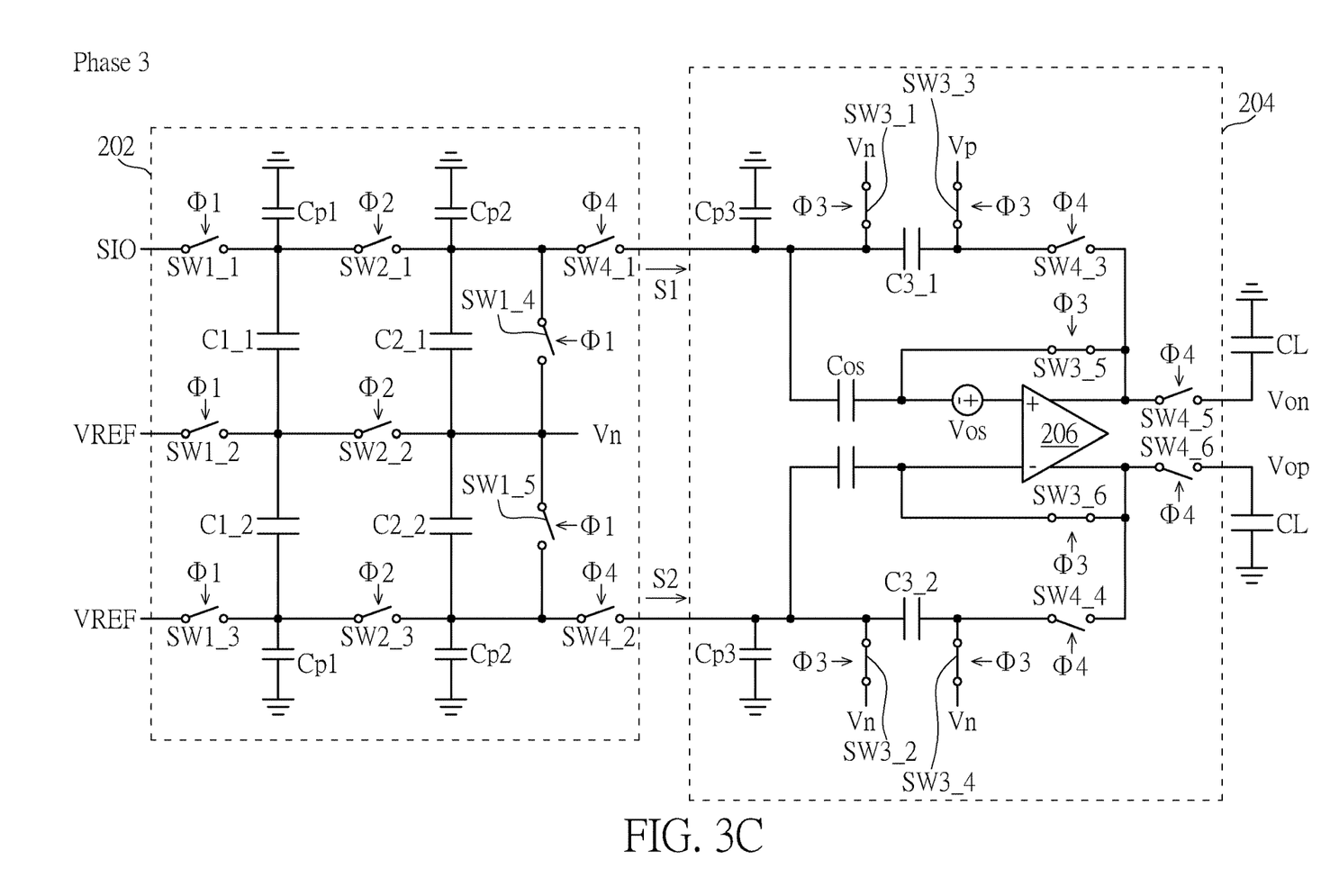

In Phase 3, the gain amplifier 204 starts to operate, where the switches SW3_1-SW3_6 are conducted by the switching signal Φ3, and other switches are turned off, as shown in FIG. 3C. Phase 3 is a reset phase for the gain amplifier 204. In this phase, a terminal of the capacitor C3_1 receives a bias voltage Vn and another terminal of the capacitor C3_1 receives a bias voltage Vp, and both terminals of the capacitor C3_2 receives the bias voltage Vn. The bias voltages Vn and Vp provide a DC shift to shift the output signals Von and Vop to a desired voltage level.

Figure 3D:
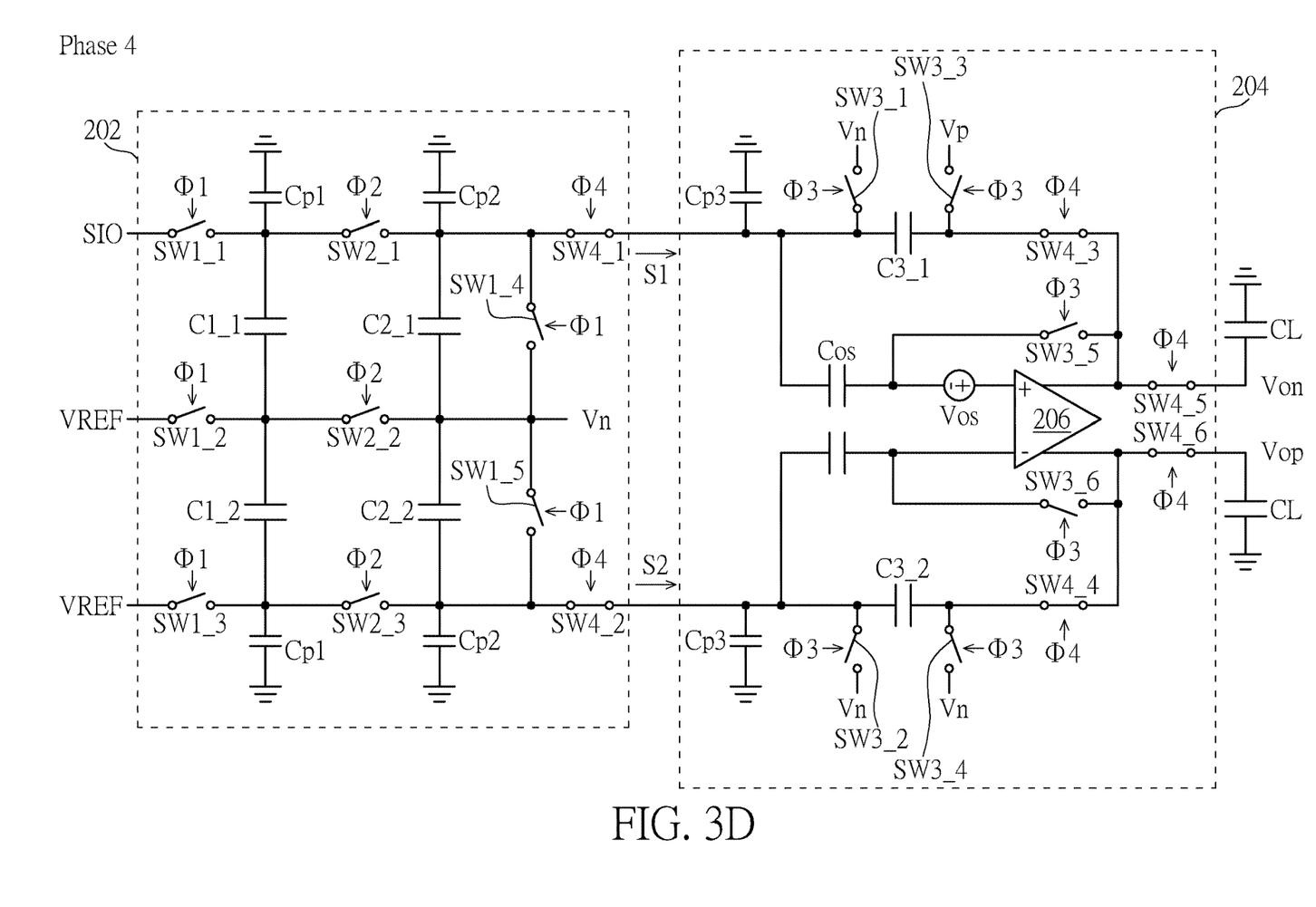

In Phase 4, the switches SW4_1-SW4_6 are conducted by the switching signal Φ4, and other switches are turned off, as shown in FIG. 3D. The conducted switches SW4_1-SW4_2 allow the sampling signals S1 and S2 to be outputted from the sample and hold circuit 20 to the gain amplifier 204. The conducted switches SW4_3-SW4_6 and the capacitors C3_1 and C3_2 form the closed loop of the gain amplifier 204, so as to amplify the sampling signals S1 and S2 to generate the output signals Von and Vop. In this phase, the DC shift generated from the bias voltages Vn and Vp is also sampled to the output terminals of the gain amplifier 204.

Please note that the offset voltage Vos in the gain amplifier 204 is an unwanted voltage difference between the two input terminals of the operational amplifier 206, and should be canceled in order to obtain accurate output signals Von and Vop. With the switching operations in the gain amplifier 204, the offset voltage Vos may be sampled in Phase 3, and then be sampled to and stored in the capacitors C3_1 and C3_2 in Phase 4. Therefore, the offset voltage Vos will be canceled from the output signals Von and Vop after Phase 4 is complete.

The sensing circuit 20 receives the sensing signal SIO and outputs the output signals Von and Vop, and the corresponding transfer function may be obtained as follows:

$$V_{od1} = \left(\frac{C1 + Cp1}{C1 + Cp1 + C2 + Cp2}\right)\left(\frac{(C2 + Cp2)/C3}{\frac{(C2 + Cp2 + C3 + Cp3)}{A \times C3} + 1}\right)(SIO - VREF) - \frac{1}{\frac{(C2 + Cp2 + C3 + Cp3)}{A \times C3} + 1}(Vp - Vn) +$$

-continued $$\frac{\left(\frac{C2+Cp2+C3+Cp3}{(A+1)\times C3}\right)}{\frac{(C2+Cp2+C3+Cp3)}{A\times C3}+1}Vos$$

wherein $V_{od1}$ is the differential output signal of the sensing circuit 20 and equal to Vop minus Von, C1 is the capacitance value of the capacitors C1_1 and C1_2, C2 is the capacitance value of the capacitors C2_1 and C2_2, C3 is the capacitance value of the capacitors C3_1 and C3_2, and A is the open loop gain of the operational amplifier 206. In this transfer function, the first term (with SIO-VREF) is a gain factor, the second term (with Vp−Vn) is associated with DC shift, and the third term (with Vos) is associated with offset cancellation. Note that the gain factor stands for the differential gain of the gain amplifier 204, which is highly influenced by the parasitic capacitances Cp1, Cp2 and Cp3. As mentioned above, most of the parasitic capacitances Cp1, Cp2 and Cp3 are generated from junction capacitances of MOSFETs, which are highly dependent on temperature and influenced by process variations. Therefore, the differential gain of the gain amplifier 204 may be severely influenced by temperature and/or process variations, which reduces the uniformity of amplification operations between different channels in the sensing circuit 20.

Figure 4:
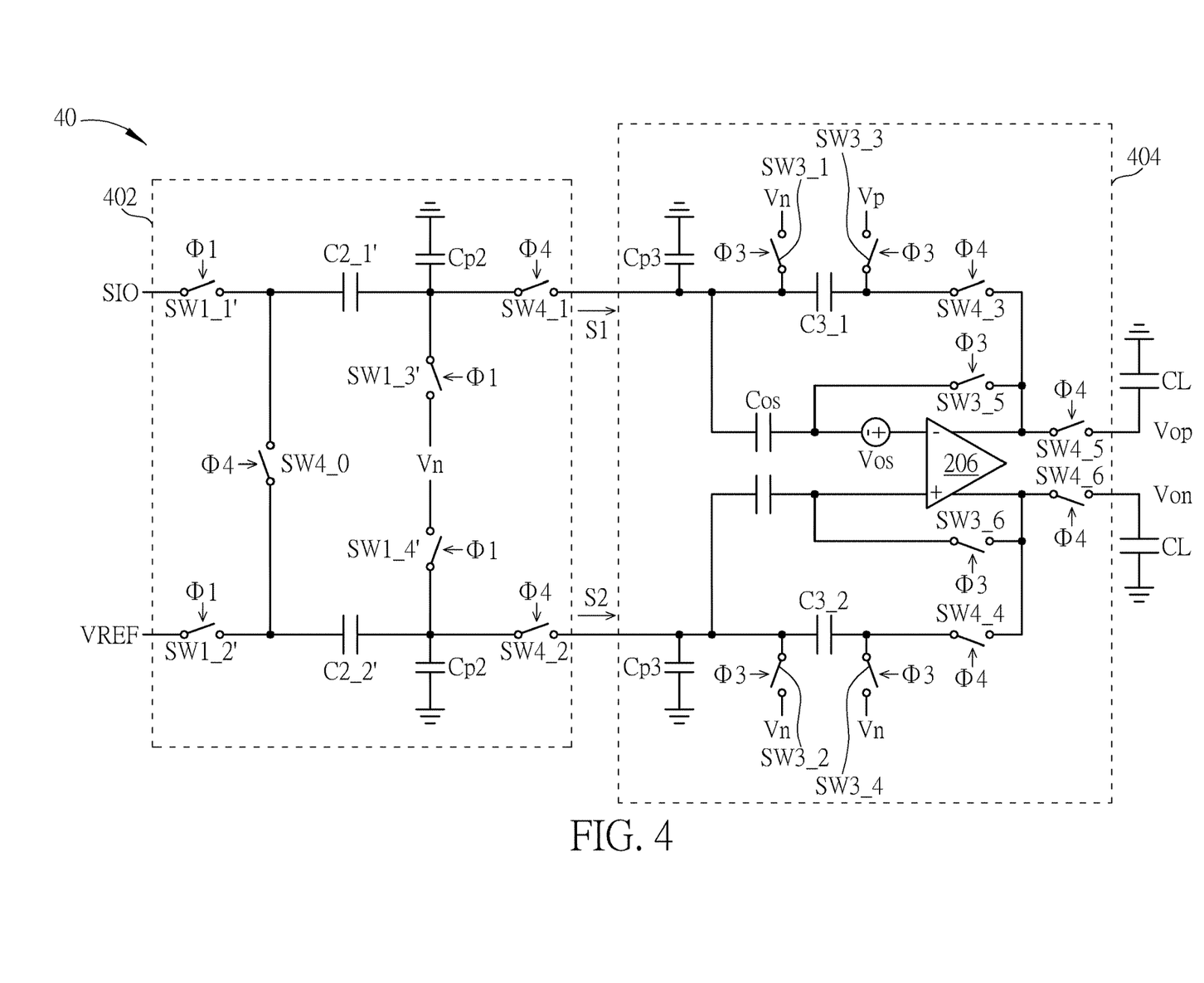
FIG. 4 is a schematic diagram of a sensing circuit according to an embodiment of the present invention.

The present invention provides a novel structure of the sample and hold circuit to improve the uniformity of the sensing circuit. Please refer to FIG. 4, which is a schematic diagram of a sensing circuit 40 according to an embodiment of the present invention. The sensing circuit 40, which may be implemented in an OLED driver for sensing parameters of pixel elements in the OLED driver, includes a sample and hold circuit 402 and a gain amplifier 404. Note that there may be multiple channels included in the sensing circuit 40 and each channel is composed of a sample and hold circuit and a gain amplifier, and only one channel is illustrated in FIG. 4 for brevity. The detailed operations of the sensing circuit 40 are similar to those of the sensing circuit 20, and thus elements and signals with similar functions are denoted by the same symbols.

In detail, the sample and hold circuit 402 is configured to sample a sensing signal SIO received from a sensing line of the OLED driver, and thereby output sampling signals S1 and S2. The sample and hold circuit 402 includes capacitors C2_1' and C2_2' and switches SW1_1', SW1_2', SW1_3', SW1_4', SW4_0, SW4_1 and SW4_2. The switches SW1_1', SW1_2', SW1_3' and SW1_4' are controlled by a switching signal Φ1, and the switches SW4_0, SW4_1 and SW4_2 are controlled by a switching signal Φ4. The capacitor C2_1' is coupled between an input terminal that receives the sensing signal SIO and the gain amplifier 404, for coupling the sensing signal SIO from the input terminal to the gain amplifier 404. The capacitor C2_2' is coupled between a reference terminal and the gain amplifier 404, for coupling the reference voltage VREF from the reference terminal to the gain amplifier 404. The switch SW1_1' is coupled between the capacitor C2_1' and the input terminal, for transmitting the sensing signal SIO to the capacitor C2_1'. The switch SW1_2' is coupled between the capacitor C2_2' and the reference terminal, for transmitting the reference voltage VREF to the capacitor C2_2'. The switch SW1_3' is coupled between the capacitor C2_1' and a bias terminal, and the switch SW1_4' is coupled between the capacitor C2_2' and the bias terminal. The switches SW1_3' and SW1_4' are served to provide the bias voltage Vn for the capacitors C2_1' and C2_2', respectively. The switch SW4_0 is coupled between the capacitors C2_1' and C2_2', to perform charge sharing or reset the capacitors C2_1' and C2_2'. The switch SW4_1 is coupled between the capacitor C2_1' and the gain amplifier 404, and the switch SW4_2 is coupled between the capacitor C2_2' and the gain amplifier 404. The switches SW4_1 and SW4_2 operate as similar to those in the sensing circuit 20, for outputting the sampling signals S1 and S2 to the gain amplifier 404 when conducted. In addition, in the sample and hold circuit 402, there are parasitic capacitances Cp2 coupled to a terminal of the capacitors C2_1' and C2_2', where the parasitic capacitances Cp2 may be generated from junction capacitances of MOSFETs as described above.

The gain amplifier 404 receives the sampling signals S1 and S2, and thereby generates output signals Von and Vop. The detailed implementations and operations of the gain amplifier 404 are identical to those of the gain amplifier 204, and will not be narrated herein. Note that the sensing circuit 40 is different from the sensing circuit 20 in the structure of the sample and hold circuit, where the structure of the sample and hold circuit 402 of the sensing circuit 40 is simplified and more immune to the temperature and process variations.

The detailed operations of the sensing circuit 40 may also be separated into several phases, as described below.

Figure 5A:
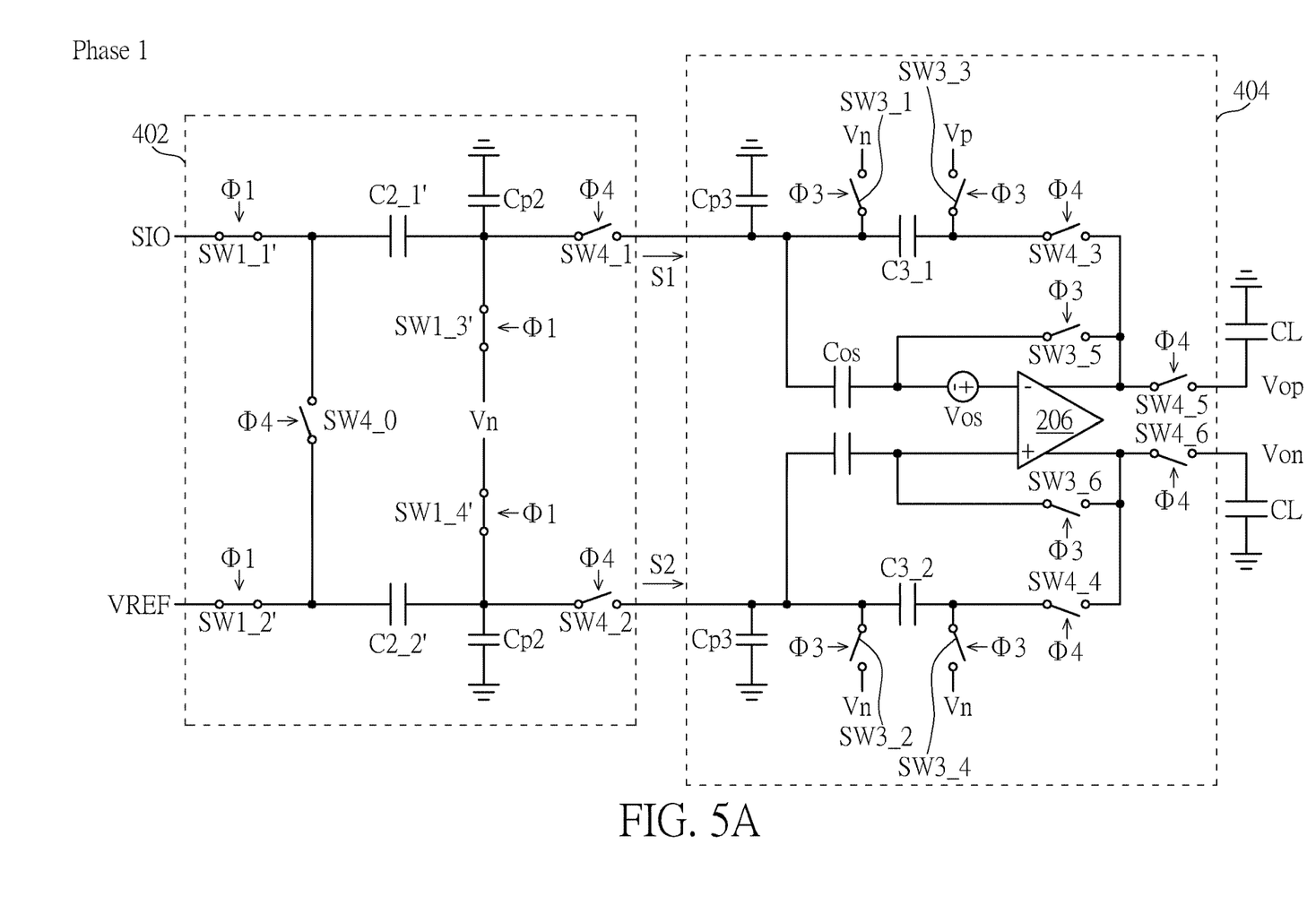
FIGS. 5A-5D are schematic diagrams of operations of the switches in the sensing circuit shown in FIG. 4.

In Phase 1, the switches SW1_1'-SW1_4' are conducted by the switching signal Φ1, and other switches are turned off, as shown in FIG. 5A. The sensing signal SIO is received by the sample and hold circuit 402 and sampled to be stored in the capacitor C2_1' via the switch SW1_1'. The reference voltage VREF is also received and sampled to be stored in the capacitor C2_2' via the switch SW1_2', as a reference for generating the differential output. A bias voltage Vn is provided for the capacitors C2_1' and C2_2' via the switches SW1_3' and SW1_4', respectively. The reference voltage VREF and/or the bias voltage Vn may be provided from a system circuit and preconfigured to a voltage level which allows the sensing circuit 40 to be adaptive to any possible sensing signal SIO received from the OLED panel. After Phase 1 is complete, the information of the sensing signal SIO is sampled and stored in the capacitor C2_1'.

Figure 5B:
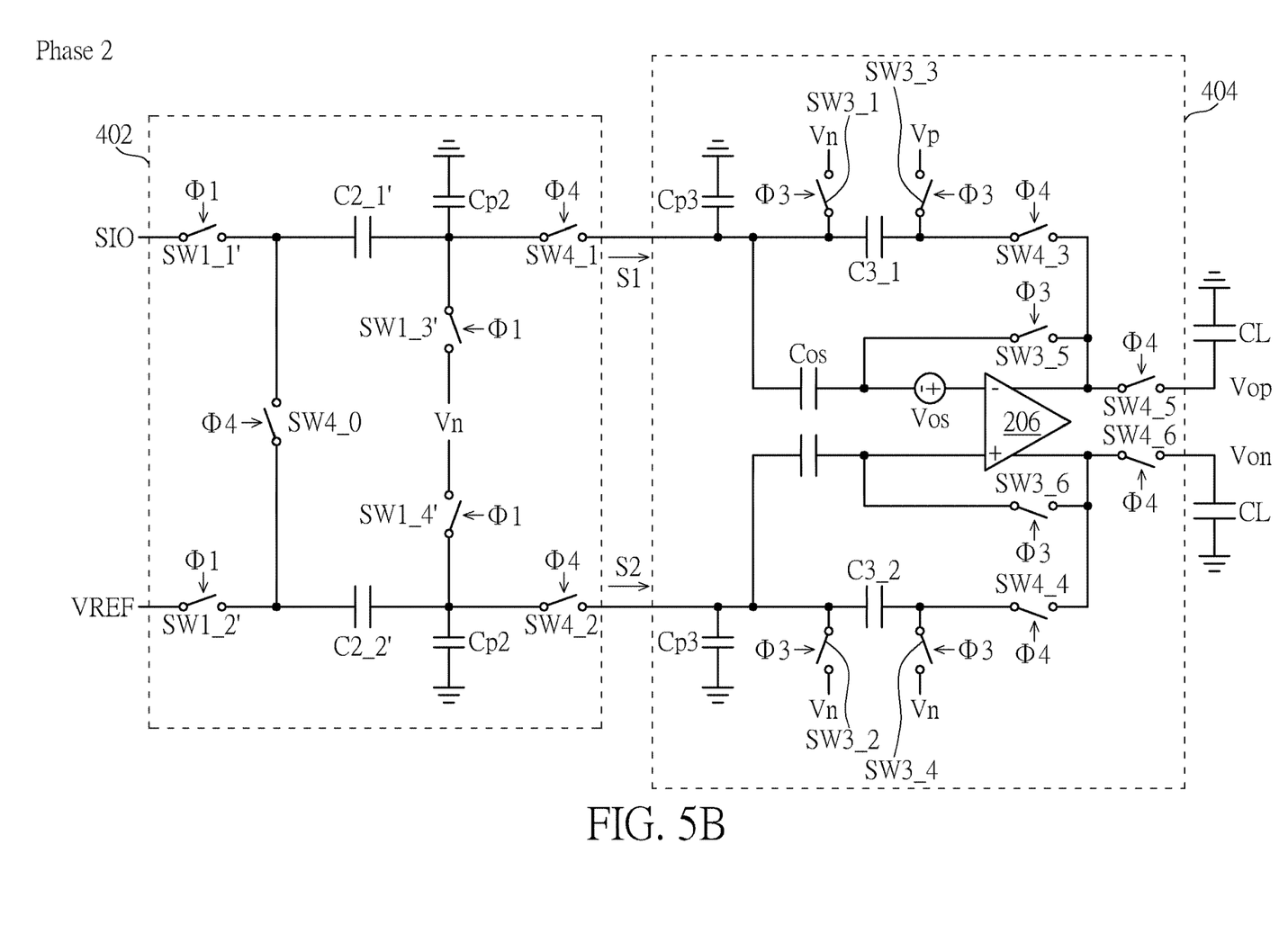

Phase 2 refers to a phase or step where every switch in the sensing circuit 40 is turned off, as shown in FIG. 5B. Since the sample and hold circuit 402 is much simpler with only one capacitor C2_1' for sampling the sensing signal SIO and only one capacitor C2_2' for sampling the reference voltage VREF, there is no need to sample the sensing signal SIO from one capacitor to another capacitor in the sample and hold circuit 402, which simplifies the operations of the sample and hold circuit 402.

Figure 5C:
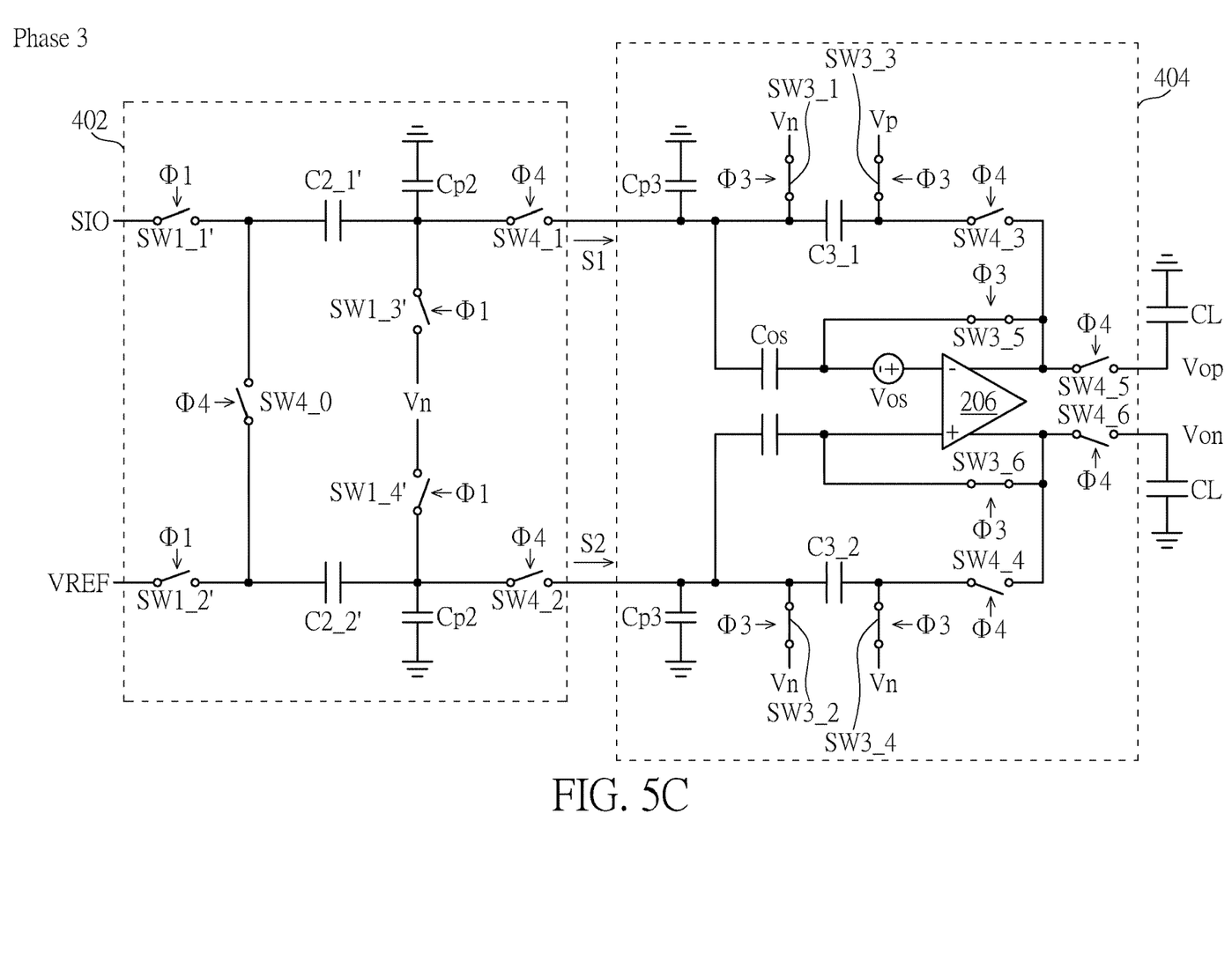
Figure 5D:
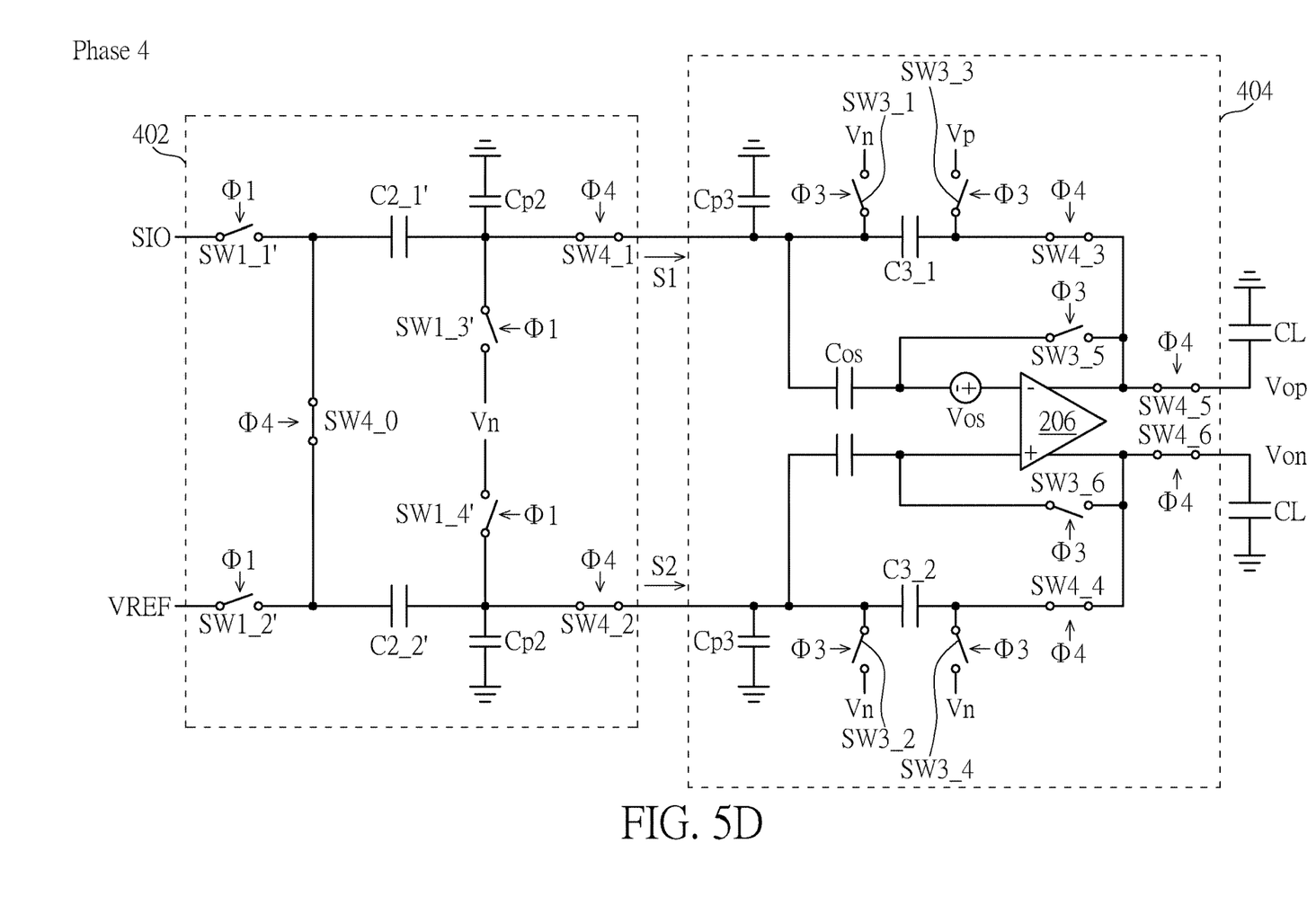

In the operations of the sensing circuit 40, Phase 3 and Phase 4 are related to the operations of the gain amplifier 404, which are identical to the operations of the gain amplifier 204 described in the above paragraphs. The detailed implementations of Phase 3 and Phase 4 are illustrated in FIGS. 5C and 5D, respectively, and will not be narrated herein.

With the simplified structure in the sensing circuit 40, the transfer function may be obtained as follows:

$$V_{od2} = -\left(\frac{C2/C3}{\frac{(C2+Cp2+C3+Cp3)}{A\times C3}+1}\right)(SIO-VREF)-$$

-continued $$\frac{1}{\frac{(C2+Cp2+C3+Cp3)}{A\times C3}+1}(Vp-Vn)+$$

$$\frac{\left(\frac{C2+Cp2+C3+Cp3}{(A+1)\times C3}\right)}{\frac{(C2+Cp2+C3+Cp3)}{A\times C3}+1}Vos$$

wherein $V_{od2}$ is the differential output signal of the sensing circuit 40 and equal to Vop minus Von, C2 is the capacitance value of the capacitors C2_1' and C2_2', C3 is the capacitance value of the capacitors C3_1 and C3_2, and A is the open loop gain of the operational amplifier 206. In this transfer function, the second term (with Vp−Vn) is associated with DC shift, and the third term (with Vos) is associated with offset cancellation. These two terms are identical to those of the transfer function of the sensing circuit 20 since the structure and operations of the gain amplifier are identical.

As shown in the transfer function of the sensing circuit 20, the differential input signal SIO−VREF is multiplied by a differential gain including parasitic capacitances Cp1, Cp2 and Cp3, wherein the parasitic capacitances Cp1 and Cp2 severely influence the differential gain with the factors (C1+Cp1)/(C1+Cp1+C2+Cp2) and (C2+Cp2)/C3. In comparison, in the transfer function of the sensing circuit 40, the factor of parasitic capacitance remains (C2+Cp2+C3+Cp3)/A×C3 only, where the parasitic capacitance Cp1 has been omitted. In addition, the parasitic capacitances Cp2 and Cp3 are divided by the open loop gain A which may have a high value; hence, the influence of the parasitic capacitances Cp2 and Cp3 on the differential gain is substantially attenuated. Therefore, in the sensing circuit 40, the differential gain is much immune to the influence of the parasitic capacitance, since the differential gain is less sensitive to the entire parasitic capacitance in the sensing circuit 40 based on the transfer function, and there are less parasitic capacitances in the sample and hold circuit 402 of the sensing circuit 40. As mentioned above, the parasitic capacitance is highly sensitive to temperature and process variations; hence, the novel structure of the sample and hold circuit 402 will be less susceptible to the temperature and process variations. This results in a higher uniformity between the channels of the sensing circuit 40.

Please note that the present invention aims at providing a structure of the sample and hold circuit which is able to achieve the uniformity of the sensing circuit. Those skilled in the art may make modifications and alternations accordingly. For example, the structure of the sample and hold circuit may be modified or incorporated with a level shift scheme, allowing the sensing circuit to receive a voltage higher than the normal operating voltage of the sensing circuit. For different types of OLED panels, the generated sensing signal may have different ranges. In order to be adaptive to a large variety of OLED panels, a level shifter may be applied to generate a switching signal having a higher level for controlling the switch(es) in the sample and hold circuit.

Figure 6:
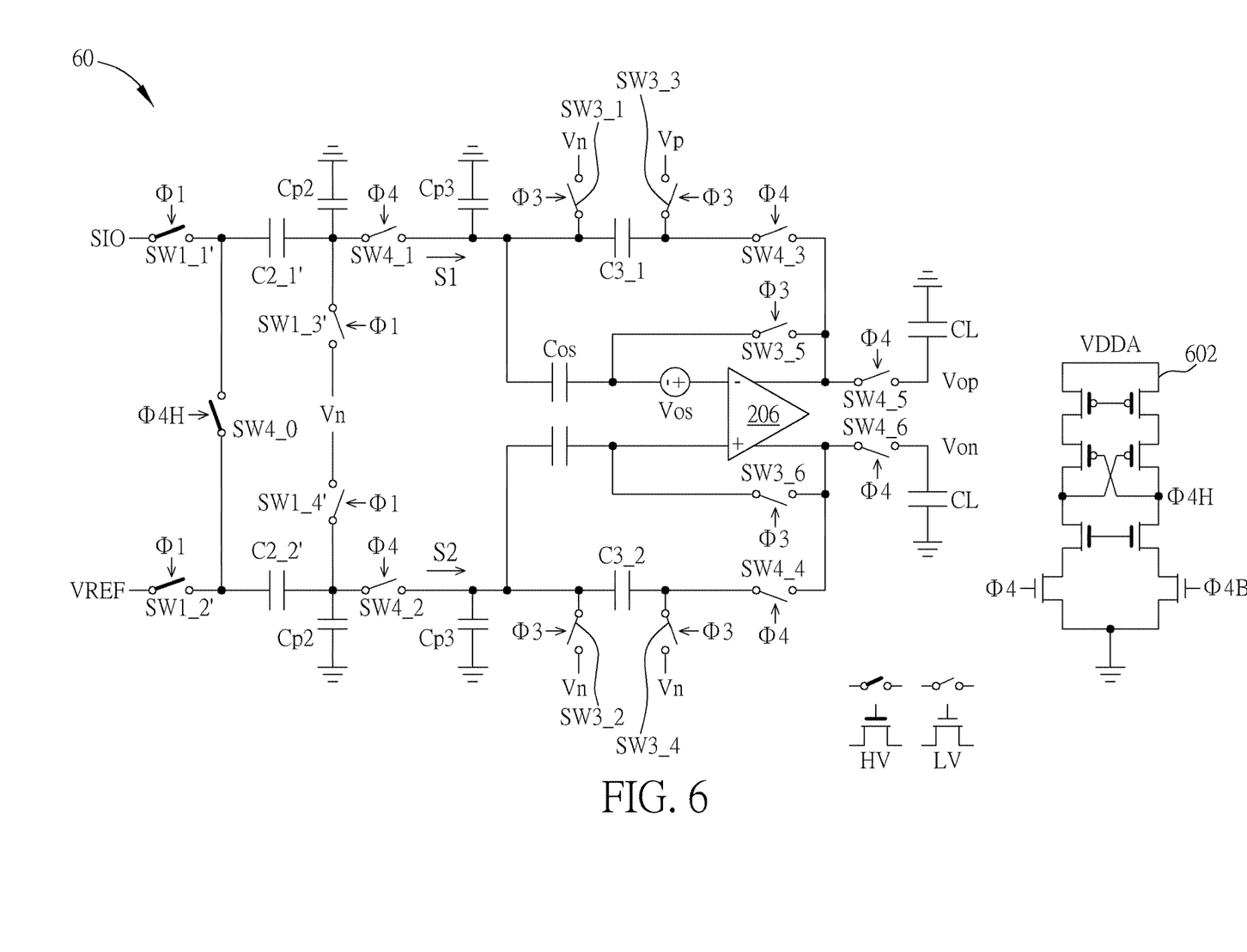
FIG. 6 is a schematic diagram of another sensing circuit according to an embodiment of the present invention.

Please refer to FIG. 6, which is a schematic diagram of another sensing circuit 60 according to an embodiment of the present invention. The structure of the sensing circuit 60 is similar to the structure of the sensing circuit 40, and the elements and signals having similar functions are denoted by the same symbols. The sensing circuit 60 is different from the sensing circuit 40 in that the sensing circuit 60 further includes a level shifter 602, and that the switch SW4_0 coupled between the input terminal and the reference terminal receives a high-level switching signal Φ4H instead of the switching signal Φ4, where the high-level switching signal Φ4H is generated by the level shifter 602. More specifically, if it is possible that the sensing signal may be greater than the normal operating voltage of the sensing circuit 60, the level shifter 602 for generating the high-level switching signal Φ4H may be applied.

Figure 7:
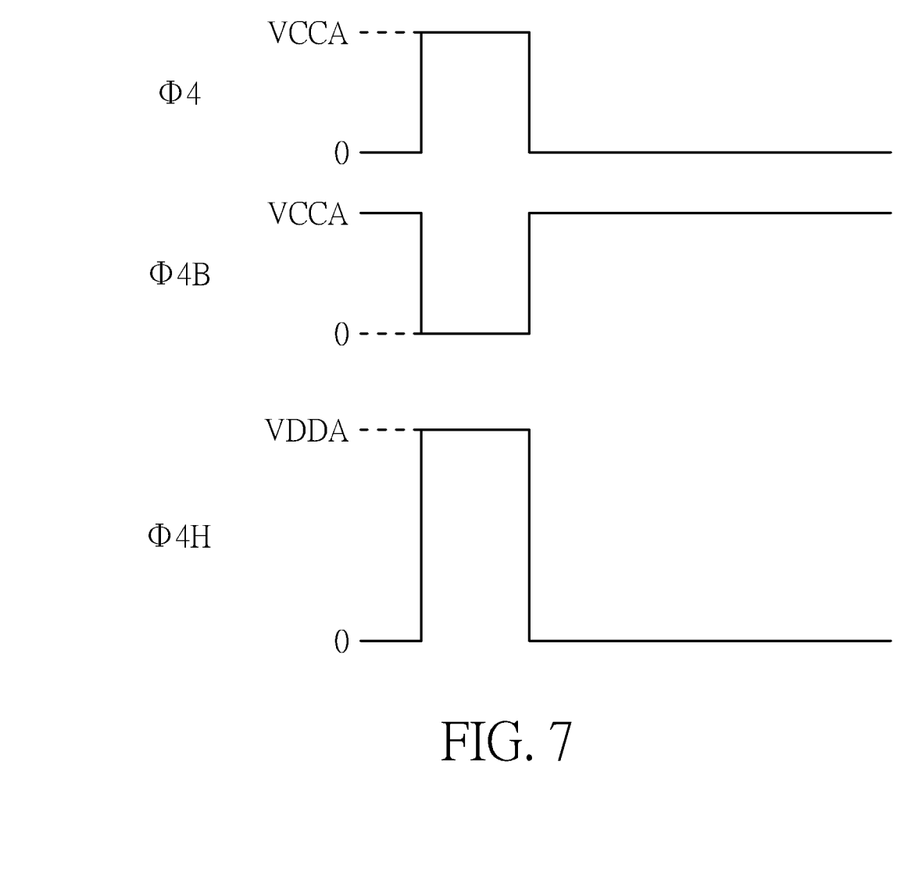
FIG. 7 is a waveform diagram of the switching signals.

In this embodiment, the level shifter 602 is coupled to the switch SW4_0, for shifting the switching signal to be outputted to the switch SW4_0. In detail, the level shifter 602 receives the switching signal Φ4 and an inverse switching signal Φ4B, and thereby generates the high-level switching signal Φ4H. The level shifter 602 operates by receiving a power supply voltage VDDA which may be higher than the normal operating voltage VCCA of the sensing circuit 60. As shown in FIG. 6, the switch SW4_0 may be implemented with a high-voltage (HV) MOSFET which is capable of receiving a higher voltage. The high-voltage MOSFET may be a MOSFET of which the gate oxide is thicker, so that the MOSFET is sustainable to higher gate-source voltage and gate-drain voltage. Preferably, the high-side transistors of the level shifter 602 may also be implemented with high-voltage MOSFETs. In an embodiment, the normal operating voltage VCCA of the sensing circuit 60 may be equal to 1.8V, while the sensing signal SIO received from an OLED panel may be up to 18V. The level shifter 602 may receive the switching signals Φ4 and Φ4B having a voltage swing equal to VCCA=1.8V, and thereby output the high-level switching signal Φ4H having a voltage swing equal to VDDA=18V. Exemplary waveforms of the switching signals Φ4, Φ4B and Φ4H are illustrated in FIG. 7.

In this embodiment, most switches in the sensing circuit 60 may be implemented with low-voltage (LV) MOSFETs conforming to the 1.8V normal operating voltage, except that the switches SW1_1', SW1_2' and SW4_0 at the input end are implemented with the high-voltage MOSFET capable of receiving the sensing signal SIO. The switching signal Φ1 for controlling the switches SW1_1' and SW1_2' may also be a high-level switching signal having a higher voltage swing adaptive to the input sensing signal SIO.

To sum up, the present invention provides a sensing circuit with a novel structure of the sample and hold circuit which is able to achieve the uniformity of the sensing circuit. The sample and hold circuit includes less parasitic capacitance, and the differential gain is less sensitive to the entire parasitic capacitance in the sensing circuit based on the transfer function; hence, the differential gain of the sensing circuit is much immune to the influence of the parasitic capacitance, so that the novel structure of the sample and hold circuit is less susceptible to the temperature and process variations. This results in a higher uniformity between the channels of the sensing circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A sensing circuit for an organic light-emitting diode (OLED) driver, comprising:
  a sample and hold circuit, configured to sample a sensing signal received via an input terminal; and a gain amplifier, coupled to the sample and hold circuit, having a first input terminal, a second input terminal, a first output terminal and a second output terminal, the gain amplifier comprising:
  an eighth switch, coupled between the first input terminal and the first output terminal, wherein a first terminal of the eighth switch is coupled to the first input terminal, and a second terminal of the eighth switch is coupled to the first output terminal; and
  a ninth switch, coupled between the second input terminal and the second output terminal, wherein a first terminal of the ninth switch is coupled to the second input terminal, and a second terminal of the ninth switch is coupled to the second output terminal;
wherein the sample and hold circuit comprises:
  a first capacitor, coupled between the input terminal and the gain amplifier,
    the first capacitor comprising:
      a first terminal, coupled to the input terminal, and a second terminal, coupled to the gain amplifier;
  a second capacitor, coupled between a reference terminal and the gain amplifier;
  a first switch, directly connected between the first terminal of the first capacitor and the input terminal;
  a second switch, directly connected between the second capacitor and the reference terminal;
  a third switch, connected between the second terminal of the first capacitor and the gain amplifier, wherein a first terminal of the third switch is directly connected to the first capacitor and a second terminal of the third switch is directly connected to the gain amplifier; and
  a fourth switch, connected between the second capacitor and the gain amplifier, wherein a first terminal of the fourth switch is directly connected to the second capacitor and a second terminal of the fourth switch is directly connected to the gain amplifier.

2. The sensing circuit of claim 1, wherein the sample and hold circuit further comprises:
  a fifth switch, coupled between the first capacitor and the second capacitor;
  a sixth switch, coupled between the first capacitor and a bias terminal; and
  a seventh switch, coupled between the second capacitor and the bias terminal.

3. The sensing circuit of claim 1, wherein the first capacitor is configured to sample the sensing signal from the input terminal.

4. The sensing circuit of claim 1, wherein the second capacitor is configured to sample a reference voltage from the reference terminal.

5. The sensing circuit of claim 1, further comprising:
  a level shifter, coupled to the fifth switch, configured to output a switching signal to the fifth switch.

* * * * *